March 29, 1966 P. J. TAMBURRO 3,243,762

PRINTED CIRCUIT CONNECTOR

Filed Oct. 18, 1963 5 Sheets-Sheet 1

INVENTOR
P. J. TAMBURRO
BY W. L. Keefauver
ATTORNEY

March 29, 1966 P. J. TAMBURRO 3,243,762

PRINTED CIRCUIT CONNECTOR

Filed Oct. 18, 1963 5 Sheets-Sheet 2

March 29, 1966 P. J. TAMBURRO 3,243,762

PRINTED CIRCUIT CONNECTOR

Filed Oct. 18, 1963 5 Sheets-Sheet 3

March 29, 1966 P. J. TAMBURRO 3,243,762

PRINTED CIRCUIT CONNECTOR

Filed Oct. 18, 1963 5 Sheets-Sheet 5

United States Patent Office 3,243,762

Patented Mar. 29, 1966

3,243,762

PRINTED CIRCUIT CONNECTOR

Peter J. Tamburro, Hanover Township, Morris County, N.J., assignor to Bell Telephone Laboratories, Incorporated, New York, N.Y., a corporation of New York Filed Oct. 18, 1963, Ser. No. 317,386

12 Claims. (Cl. 339—176)

This invention relates to electrical connectors and more particularly to a connector for interconnecting the terminals of printed circuit panels through the medium of a flat multiconductor flexible cable.

Recently, flexible flat cable has been used more frequently for interconnecting printed circuit panels. One of the principal advantages realized from the use of this type of cable is that the printed circuit panels may be connected to the tape at random intervals along its length. Printed circuitry permits miniaturization to secure greater circuit density, but in achieving greater circuit density, ease and rapidity of connection and disconnection must not be sacrificed. This latter feature is essential for maintenance purposes and where circuit changes are desired.

It is an object of this invention to improve the means for interconnecting a plurality of printed circuit panels through the medium of a flat multiconductor flexible cable.

The foregoing object is achieved by this invention which comprises a connector made up from a flat multiconductor cable woven in S-shaped configuration between two parallel rows of parallel support bars. These bars are preferably covered with a resilient material and the cable conductors are on the surface of their base material. The terminal edges of the panels are inserted between the bars in one row with their terminal lands in registry with the cable conductors. In one embodiment of the invention, the spacing between adjacent bars is slightly less than the panel thickness so that, upon insertion of the panel, the resilient covering on the bars yields to admit the panel and provides the necessary contact pressure. In another embodiment, the spacing is slightly greater than the panel thickness and a mechanical means drives the bars together to grip the panels therebetween. In still another embodiment, the conductors are arranged on both of the flat surfaces of the cable and panels may be inserted from opposite directions between both parallel rows of the parallel support bars, thereby doubling the number of printed circuit panels that may be accommodated by a single connector.

The invention may be better understood by reference to the accompanying drawings, in which.

Figure 5:
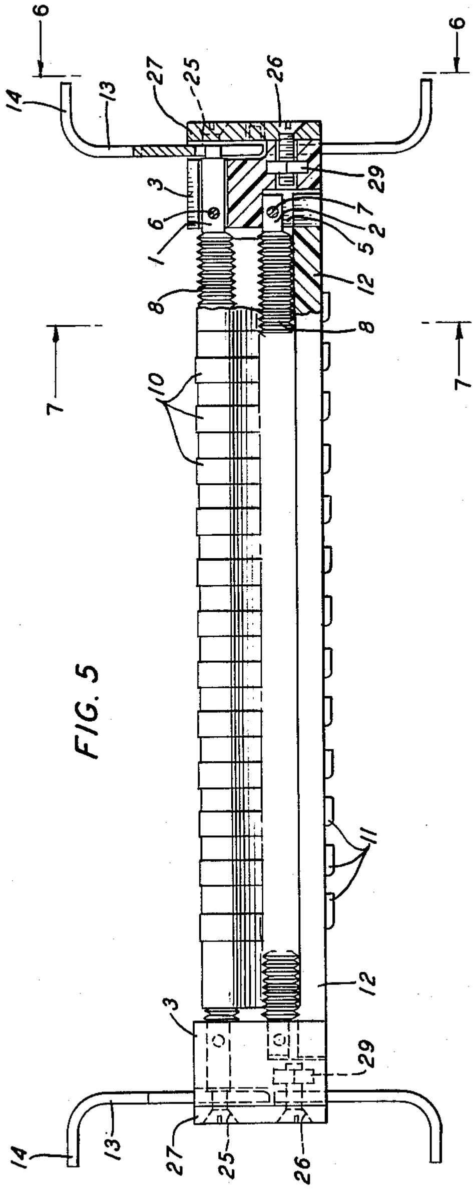
FIG. 5 is an elevation view showing an embodiment of the invention for receiving printed circuit panels between both rows of parallel bars.
Figure 7:
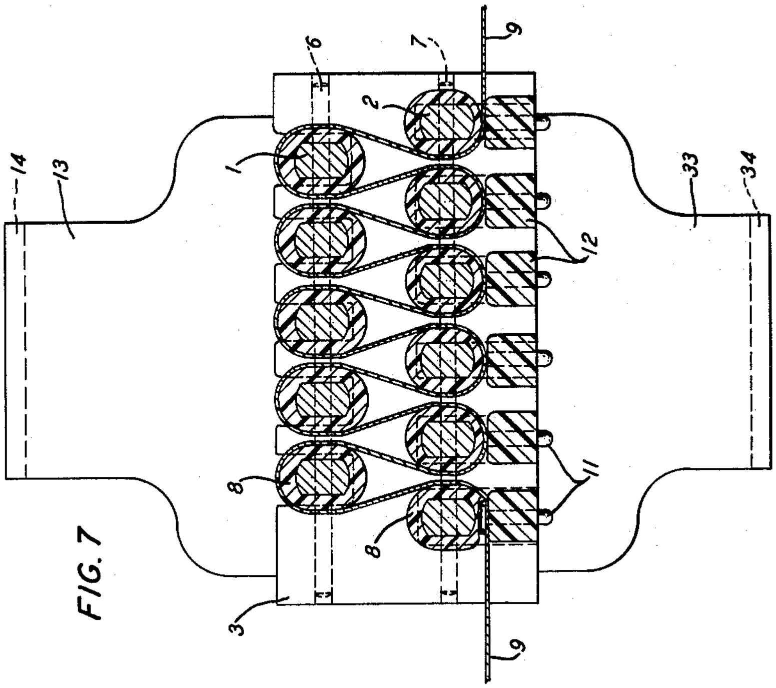
Figure 6:
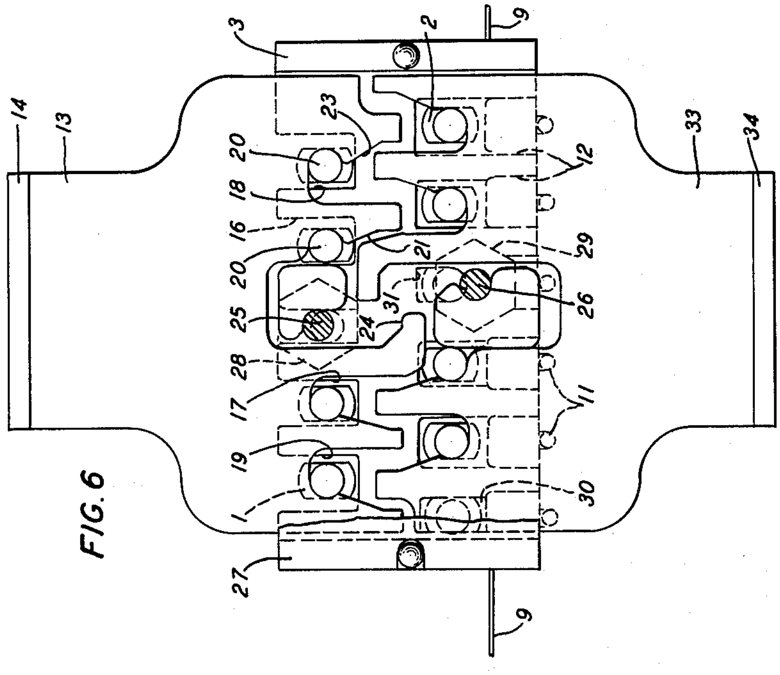
Figure 8:
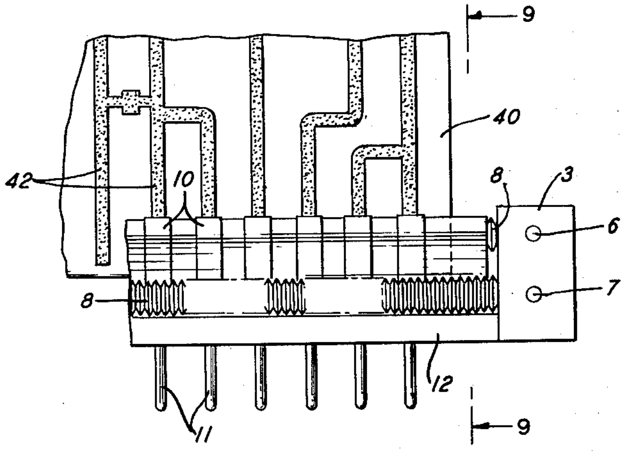
Figure 9:
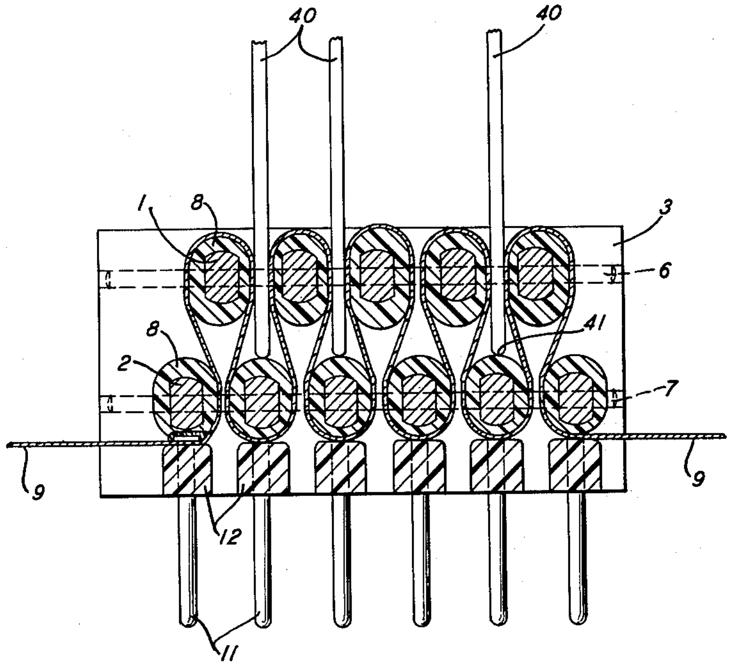

FIGS. 6 and 7 are end views taken on lines 6—6 and 7—7, respectively, of FIG. 5 to show the relationship of the two cams operating on the two rows of parallel bars and the S-shaped configuration of the tape;

FIG. 8 discloses another embodiment of the invention in which the printed circuit panels are forced between adjacent parallel bars without cams; and FIG. 9 is a section view taken on line 9—9 of FIG. 8.

Figure 1:
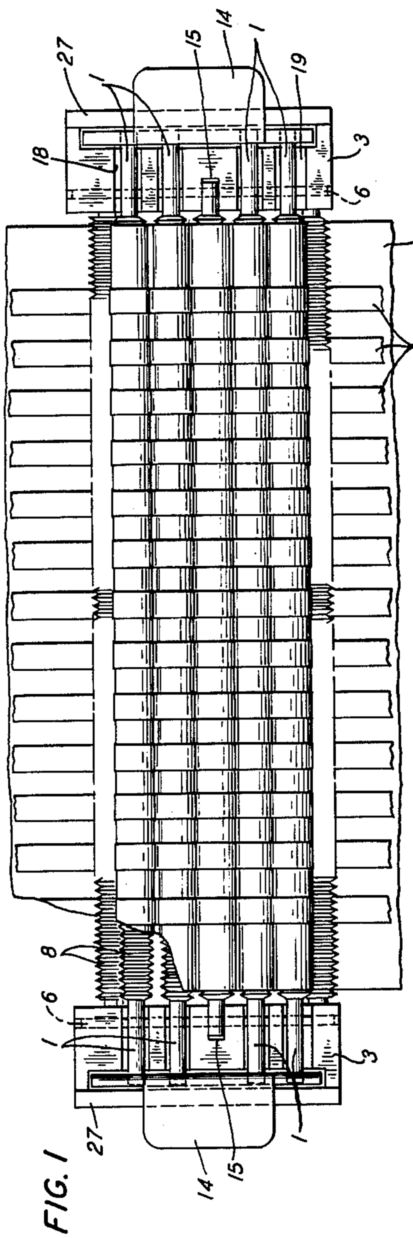
FIGS. 1 and 2 are plan and elevation views, respectively, of one embodiment of the invention intended for receiving printed circuit panels between only one row of support bars.
Figure 2:
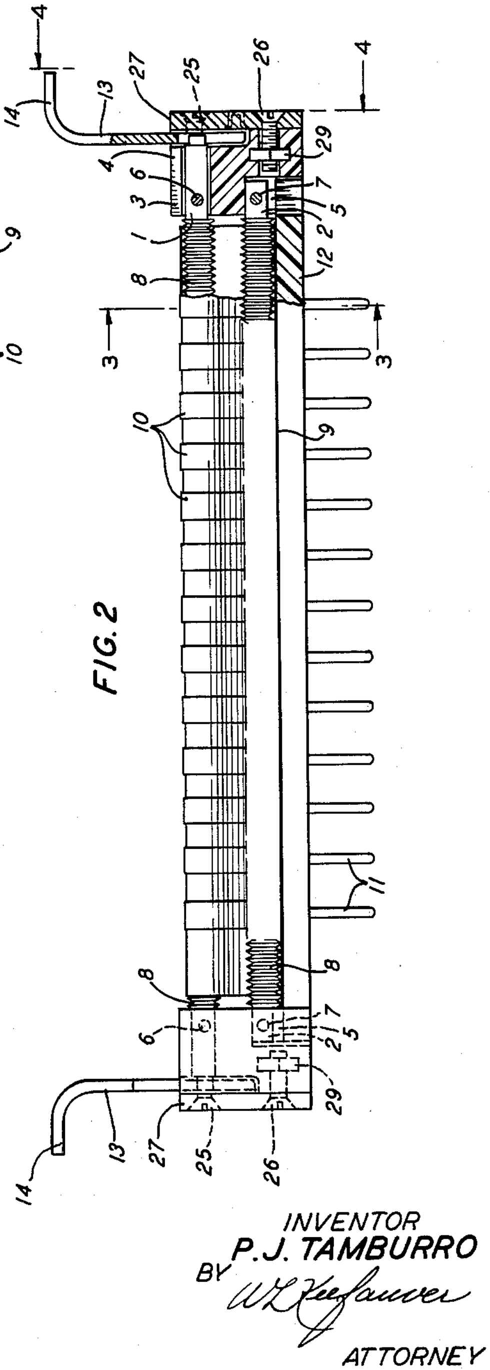
Figure 3:
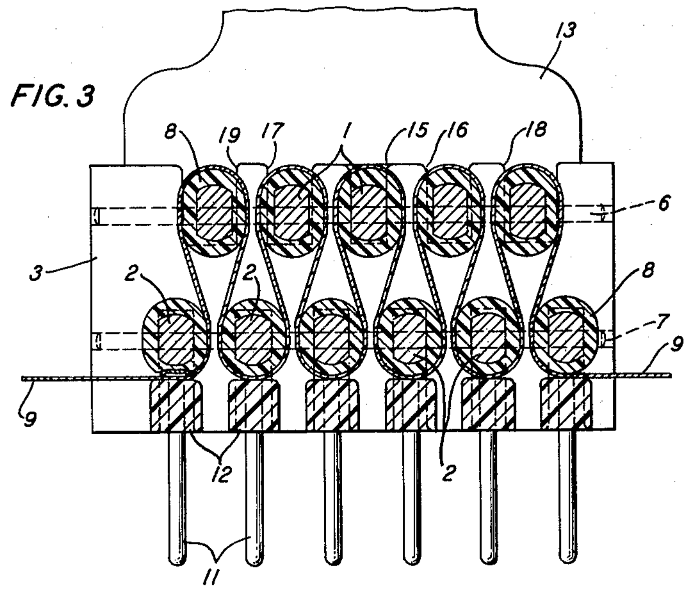
FIG. 3 is a section view taken on line 3—3 of FIG. 2 showing the S-shaped configuration of the tape and details of the parallel support bar arrangement.

The embodiment shown in FIGS. 1 and 2 comprises two rows of horizontal support bars, the upper row having five horizontal bars 1 and the lower row having six horizontal bars 2. These bars are supported at their ends by a pair of blocks 3 preferably molded of insulating material. The bars of the upper row are inserted in a row of slots 4 open at the top while the lower row of bars are inserted in another row of slots 5 open at the bottom. The rods are prevented from falling out of their slots by a pair of pins 6, 7. The holes through which these pins pass are straight and the pins are kept from falling out by simply giving them a slight bend before insertion, thereby creating lateral friction between the pins and their holes. Each of the bars is surrounded throughout that portion of its length extending between the end blocks 3, 3 by a ribbed elastic covering 8, preferably made of a good quality resilient rubber. A flat multiconductor cable 9 carrying a plurality of parallel disposed conductors 10 on its upper surface is woven in S-shaped configuration about the parallel disposed bars 1 and 2. This configuration is best shown in FIG. 3.

In this embodiment, cable conductor 9 need carry conductors 10 on only its upper surface because printed circuit panels will be inserted between only the upper row bars. As shown in FIG. 3, the flat cable 9 is woven alternately between the lower and upper bars and may extend from the connector in either direction. For this reason the connector may be placed at any position along the length of the cable. In order to prevent slippage and misalignment of the cable while inserting or removing panels, a plurality of anchor pins 11 are inserted through the tape immediately beneath each of the lower bars 2 and through a rigid support bar 12 of insulating material which is also secured at its ends in support blocks 3. Pins 11 may also provide external connections to a conventional type of pin receptacle or for testing purposes. The heads shown at the upper ends of these pins prevent passage of the pins all the way through the tape and at the same time provide a convenient means for securing the pins to the conductors 10, preferably by soldering. In assembly, these pins are passed through holes in the support bar 12 after which bar 12 is forced against the ribbed covering 8 on its adjacent horizontal support bar 2, thus securely retaining the pins in place.

Figure 4:
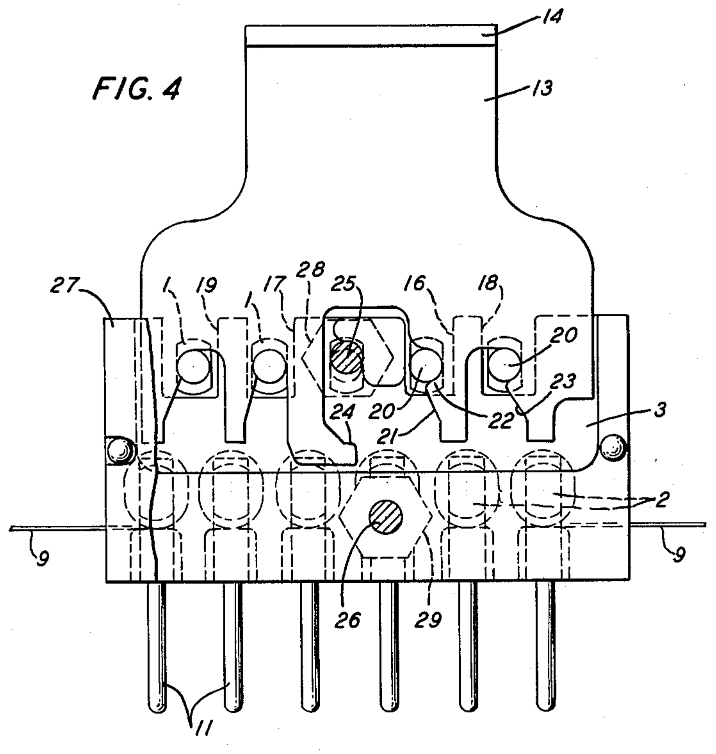
FIG. 4 is a partial section view taken on line 4—4 of FIG. 2 showing the relationship of the cam plate with the upper row of parallel bars.

To facilitate the insertion and removal of the printed circuit panels (not shown in FIG. 3) between the upper row of bars, a cam plate 13 is provided at each end of the assembly. FIG. 4 shows cam surfaces on the lower portion of this cam plate which engage the circular ends of four of the upper parallel support bars. The upper row of slots 4 (shown in FIG. 2) is shown in FIG. 3 to comprise the five slots 15, 16, 17, 18 and 19. It will be noted that the slot 15 is of the same width as the distance between the flats on bar 1. This prevents the central bar from moving in a lateral direction. However, slots 16 and 17 on either side of slot 15 are wider to permit the bars 1 therein to move laterally along their retaining pin 6. Outer slots 18 and 19 are still wider and permit greater motion of the bars therein. When the bars are all moved laterally as far as possible from the stationary central bar, the spaces between them will be uniform and of sufficient width to readily receive the printed circuit panels therebetween. While these panels are not shown in this figure, they are of the same type as those shown in FIGS. 8 and 9. The function of cam 13 is to move the bars in slots 16 and 17 a sufficient distance toward the central bar in slot 15 to grip the panels inserted therebetween. At the same time the cam will move the bars in slots 18 and 19 the necessary greater distance to similarly grip the panels inserted between them and the bars in slots 16 and 17.

A suitable cam configuration is shown in the cutaway view in FIG. 4. Here it will be noted that the ends 20 of the four bars which are to be moved are of circular cross section. For example, a cam surface 21 moves the bar in slot 16 as the cam plate 13 is forced down. The end of the bar then rests in a detent 22 in the cam plate. Similar structure is found for each of the other three bars and it will be noted that the cam surface 23 for the bar in slot 18 has a greater pitch so as to move this bar the required greater distance. The motion required is sufficient to cause the resilient covering 8, surrounding each of the parallel bars, to be slightly compressed, thereby providing the necessary contact force between the cable conductors 10 and the terminal lands on the printed circuit panels.

The cam plates 13 are retained by the retaining plates 27 (see FIGS. 2 and 4) on each end which in turn are secured to the end supporting blocks 3 by way of a pair of flat head screws 25 and 26. These are threaded into captive nuts 28 and 29, respectively. An extension 24 on the lower end of the cam plate prevents its complete withdrawal by reason of interference with screw 25.

In operation, cam plates 13 are moved upwardly by their handles 14 thereby permitting the bars in slots 16, 17, 18 and 19 to move away from the stationary bar in slot 15. The printed circuit panels may then be inserted freely in the spaces between the bars and handle 14 on each of the cams is then forced downwardly driving the ends of the bars in slots 16, 17, 18 and 19 inwardly toward the stationary bar in slot 15. As previously described, this introduces contact pressure between the conductors 10 and the printed circuit lands on the circuit panels.

FIGS. 5, 6 and 7 illustrate another embodiment of the invention in which printed circuit panels may be inserted between both the upper and lower rows of parallel bars. In this embodiment, the upper row of bars, their supports in the end blocks and their cam structures are identical to those described for the embodiment in FIGS. 1 through 4. In this case, it is assumed that conductors are carried on both of the flat surfaces of the cable 9. Slots 30 and 31, shown in FIG. 6, are of the same width as the distance across the flats of their bars so that the bars in these slots are held stationary against lateral movement. The remaining slots are made progressively larger on either side of slot 31 in the same manner previously described for slots 16 through 19 of FIGS. 3 and 4. A lower cam plate 33, similar to cam plate 13 previously described, moves the four movable bars in the slots on either side of slot 31 so as to engage the panels between them and the bar in slot 31 in the same manner as described for the embodiment of FIG. 1.

In this embodiment, it is preferable that pins 11 be shortened and bent over as best illustrated in FIG. 5. Four printed circuit panels may be inserted between the rigid support bars 12 and in the four spaces between the bars on either side of the stationary bar in slot 31. Contact pressure is provided by simply forcing cam plate 33 upwardly to clamp the panels between the bars in the same manner previously described for cam 13.

No plan view has been shown for the embodiment illustrated in FIGS. 5 through 7 as it would appear essentially identical to that shown in FIG. 1.

Where the panels are to be inserted only a few times, the cams may be eliminated and the necessary contact pressure may be obtained by simply compressing the resilient covering 8 around the parallel support bars by forcing the panels 40 between them. Such an embodiment is illustrated in FIGS. 8 and 9 where both the cams and their retaining plates are omitted. As shown in FIG. 9, the parallel bars are retained in their slots by pins 6 and 7, as before, and the width of the slots are all equal to the distance between the flats on the bars. In this way the bars are rigidly held in place in their supporting blocks 3. The spacing between adjacent bars is such that some force is required to insert the printed circuit panels. It is preferable that the lower ends 41 of these panels be rounded slightly to prevent scoring the printed conductors on the tape. As each panel is inserted, it causes the ribs on the resilient covering 8 to compress, thereby providing the necessary contact pressure.

Only those mechanical features are shown which are essential to clearly illustrate the novel features of the invention, the remaining details having been omitted for the sake of clarity. It is to be understood, of course, that the conductors 10 on the flat cable must be spaced to correspond with the terminal lands 42 illustrated in FIG. 8. The printed circuit panels 40 may be of any conventional construction, as for example, multilayer laminated structure or panels having circuits on only one or both of their outer surfaces.

Various modifications may be made in the mechanical construction by those skilled in this art without departing from the scope of the invention. For example, the specific cam structure illustrating this invention may be replaced by other equivalent well known types of cam structure. The ends of the bars may be drawn together by a simple eccentric mounted on the sides of the support blocks 3. Alternatively, these bars may be drawn together by a screw mechanism. These and ther equivalent modifications will be obvious to those skilled in this art. The cam plate is illustrated simply because it is believed that it provides the simplest and most economical construction.

What is claimed is:

1. A connector for interconnecting the terminals of printed circuit panels comprising a first row of parallel support bars, a second row of parallel support bars, said second row being positioned substantially parallel to said first row, a flat multiconductor flexible cable having exposed conductors on at least one of its oppositely disposed flat surfaces, said cable being interwoven alternately between said two rows of support bars so that an endwise projection of said bars presents an S-shaped configuration of said cable, the conductors of said cable being spaced to correspond with the terminal spacing of the panels to which they are to connect and the spaces between any two adjacent bars in at least one row being such as to receive one of said panels therebetween, and means for exerting a force against the bars in said one row to cause firm electrical engagement between the cable conductors passing over said bars and the terminals of the panels inserted between them.

2. A combination of claim 1 wherein said means for exerting a force comprises resilient insulating material covering the bars in said row of such thickness that the spaces between any two adjacent bars in that row is less than the thickness of the panels to be inserted.

3. The combination of claim 2 wherein said insulating material has a ridged outer surface to increase its surface flexibility.

4. The combination of claim 1 wherein said means for exerting a force comprises a cam positioned to engage the bars in said one row to force them closer together.

5. The combination of claim 4 wherein the bars in said one row are covered with a resilient insulating material.

6. The combination of claim 5 wherein said insulating material has a ridged outer surface to increase its surface flexibility.

7. A connector for interconnecting the terminals of printed circuit panels comprising a first row of parallel support bars, a second row of parallel support bars, said second row being positioned substantially parallel to said first row, a flat multiconductor flexible cable having exposed conductors on both of its oppositely disposed flat surfaces, said cable being interwoven alternately between said two rows of support bars so that an endwise projection of said bars presents an S-shaped configuration of said cable, the conductors of said cable being spaced to correspond with the terminal spacing of the panels to which they are to connect and the space between adjacent bars in each row being such as to receive said panels therebetween, and means for exerting a force against the bars in each of said rows to cause firm electrical engagement between the cable conductors passing over said bars and the terminals of the panels inserted between them.

8. The combination of claim 7 wherein said means for exerting a force comprises resilient insulating material covering said bars of such thickness that the space between any two adjacent bars in the same row is less than the thickness of the panels to be inserted.

9. The combination of claim 8 wherein said insulating material has a ridged outer surface to increase its surface flexibility.

10. The combination of claim 7 wherein said means for exerting a force comprises a cam for each row positioned to engage its bars and force them closer together.

11. The combination of claim 10 wherein said bars are covered with a resilient insulating material.

12. The combination of claim 11 wherein said insulating material has a ridged outer surface to increase its surface flexibility.

References Cited by the Examiner

UNITED STATES PATENTS

| | | | |
|---|---|---|---|
| 2,748,321 | 5/1956 | Kamm | 339—17 X |
| 3,102,767 | 9/1963 | Schneck | 339—176 |
| 3,126,244 | 3/1964 | Raygor et al. | 339—217 X |
| 3,173,732 | 3/1965 | James | 339—176 X |

JOSEPH D. SEERS, *Primary Examiner.*

W. D. MILLER, *Assistant Examiner.*